(12) United States Patent
Takahashi et al.

(10) Patent No.: US 7,041,956 B2
(45) Date of Patent: May 9, 2006

(54) SOLID-STATE IMAGE PICKUP DEVICE WITH NON-HYDROGEN-ABSORBING WAVEGUIDE

(75) Inventors: Shingo Takahashi, Kanagawa (JP); Yoshiyuki Enomoto, Kanagawa (JP); Hideshi Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/863,654

(22) Filed: Jun. 8, 2004

(65) Prior Publication Data
US 2004/0251395 A1    Dec. 16, 2004

(30) Foreign Application Priority Data
Jun. 11, 2003  (JP) ............................. P2003-167007

(51) Int. Cl.
*H01L 27/00*    (2006.01)

(52) U.S. Cl. ................. 250/208.1; 250/216; 250/214.1; 257/432; 257/225; 385/12; 385/14; 385/129; 385/130; 385/131

(58) Field of Classification Search ............. 250/208.1, 250/216, 214 R, 214.1, 227.11, 227.24; 257/225, 257/432; 385/94, 129–131, 14, 18, 92
See application file for complete search history.

(56) References Cited

U.S. PATENT DOCUMENTS

| | | | | |
|---|---|---|---|---|
| 5,844,290 A | * | 12/1998 | Furumiya | .................... 257/432 |
| 6,246,081 B1 | * | 6/2001 | Abe | ........................... 257/294 |
| 6,255,640 B1 | * | 7/2001 | Endo et al. | .............. 250/208.1 |
| 6,259,083 B1 | * | 7/2001 | Kimura | .................... 250/208.1 |

* cited by examiner

*Primary Examiner*—Stephone B. Allen
*Assistant Examiner*—Davienne Monbleau
(74) *Attorney, Agent, or Firm*—Sonnenschein Nath & Rosenthal LLP

(57) ABSTRACT

A solid-state image pickup device 100 is constructed in which a waveguide 15 is formed in an insulating layer on a light-receiving sensor portion 2, a side wall 161 of the waveguide 15 is covered with a reflective film 17 made of an Al film deposited by a CVD method, an underlayer film 19 is formed between the reflective film 17 and the side wall 161 of the waveguide 15 and the underlayer film 19 is made of a VIb-group element. It is possible to obtain a solid-state image pickup device including a waveguide in which hydrogen supplied to the light-receiving sensor portion 2 can be restrained from being absorbed by the underlayer film 19 and which has the reflective film 17 of high reflectivity with satisfactory surface condition, satisfactory coverage and excellent adhesion.

2 Claims, 9 Drawing Sheets

SOLID-STATE IMAGE PICKUP DEVICE WITH NON-HYDROGEN-ABSORBING WAVEGUIDE

BACKGROUND OF THE INVENTION

1. Field of the Invention

The present invention relates to a solid-state image pickup device, and particularly to a solid-state image pickup device in which a light-receiving sensor portion has a waveguide provided thereon to increase efficiency at which incident light is focused on the light-receiving sensor portion.

2. Description of the Related Art

In most cases of a CCD (charge-coupled device) or a CMOS (complementary metal-oxide-semiconductor) type solid-state image pickup devices, it has an arrangement in which an on-chip microlens is disposed on a plurality of light-receiving sensor portions composed of photo-diodes, for example, comprising pixels through an insulating layer to bring a focal point of incident light passed through the on-chip microlens near the light-receiving sensor portion to thereby guide light into the light-receiving sensor portion.

However, as the insulating layer progressively increases its thickness in accordance with reduction of a size of a pixel and increase of multilayer interconnection layers, it is unavoidable that the increase of the thickness of the insulating layer will exert a more serious influence upon efficiency at which incident light is focused on the light-receiving sensor portion.

As a method of avoiding such problem, there has been known, in recent years, an arrangement in which an insulating layer has a waveguide located at its position opposing a light-receiving sensor portion to efficiently guide light passed through an on-chip microlens into the light-receiving sensor portion (see cited patent references 1, 2 and 3, for example).

FIG. 1 of the accompanying drawings shows a solid-state image pickup device having such arrangement, for example, an arrangement of a CMOS type solid-state image pickup device.

More specifically, FIG. 1 is a cross-sectional view showing an arrangement of one pixel portion of a CMOS type solid-state image pickup device.

A CMOS type solid-state image pickup device, generally depicted by the reference numeral 30 in FIG. 1, has a semiconductor substrate 31 in which a light-receiving sensor portion 32 is formed at its predetermined position. The semiconductor substrate 31 has formed thereon a silicon oxide film (SiO$_2$ film) 33 having insulating function, surface-protection function or surface planarization function, and the silicon oxide film 33 has formed thereon a silicon nitride film (SiN film) 34 having surface-protection function or function to supply hydrogen to the light-receiving sensor portion 32. Then, the silicon nitride film 34 has formed thereon a non-added silicate glass (NSG film) 35, for example, and the NSG film 35 has formed thereon an interconnection layer 36.

The interconnection layer 36 is composed of three layers of interconnection layers 361, 362 and 363. Each of the interconnection layers 361, 362, 363 has an arrangement in which an interconnection material (for example, Cu) 39 is filled into a groove 38 formed at the predetermined position of an insulating film (for example, SiO$_2$ film) 37.

A film 40 is what might be called a barrier film (for example, SiN film, SiC film) formed between the respective interconnection layers 36 in order to prevent the interconnection material (Cu) 39 from being diffused into the insulating film 37. Although not shown, the barrier film 40 is also formed around the groove 38, for example, in order to prevent the interconnection material 39 from being diffused into the insulating film 37.

A passivation film 41 is formed over the interconnection layer 363 of the uppermost layer through the insulating film 37, and a color filter 43 is formed on the passivation film 41 through a planarization film 42.

The color filter 43 has an on-chip microlens 43 formed at its position corresponding to the light-receiving sensor portion 32.

A waveguide 45 for improving focusing efficiency of incident light is formed from the insulating layer (for example, including one portion of the NSG film 35, the barrier layer 40 and the SiN film 34 in addition to the insulating film 37) to the lower end of the passivation film 41.

The waveguide 45 has an arrangement in which only a side wall 461 of a hole (opening) 46 bored through the insulating layer (for example, including one portion of the NSG film 35, the barrier film 40 and the SiN film 34 in addition to the insulating film 37) is covered with a reflective film 47, a material film (SiO$_2$ film) 48 transparent to visible light being filled into the hole 46.

While a thin film having high reflectivity, for example, Al film, Ag film, Au film, Cu film and W film can be used as the reflective film 47, the Al film is most suitable for the application to the reflective film 47 from the standpoints in which it has much experience in the semiconductor manufacturing process, it can be easily processed and it has high reflectivity.

In the CMOS type solid-state image pickup device 30 having the above-mentioned arrangement, light introduced into the waveguide 45 through the on-chip microlens 44 is guided into the light-receiving sensor portion 32 while it is being reflected by the reflective film 47 that covers the side wall 461 of the hole 46.

Next, a method of manufacturing such CMOS type solid-state image pickup device, in particular, a method of forming the waveguide will be described below with reference to FIGS. 2A to 2F.

In FIGS. 2A to 2F, elements and parts identical to those of FIG. 1 are denoted by the identical reference numerals.

As shown in FIG. 2A, let us start describing first the state in which the light-receiving sensor portion 32 has already been formed at the predetermined position of the semiconductor substrate 31 to receive light incident thereon and in which the respective layers of the three interconnection layers 361, 362, 363 and the insulating film (SiO$_2$ film) 37 have already been formed over the light-receiving sensor portion 32.

Next, a resist film (not shown) is formed on the insulating film (SiO$_2$ film) 37 formed on the interconnection layer 363 of the uppermost layer, and a resist mask 50 with a pattern for use in forming the waveguide 45 is formed by patterning this resist film according to the well-known lithography technique as shown in FIG. 2B.

Thereafter, the insulating layer (for example, including the NSG film 35, the barrier film 40 and the SiN film 34 in addition to the insulating film 37) is etched away from the light-receiving sensor portion 32 through this resist mask 50 by a reactive ion etching method (RIE method), for example.

In consequence, as shown in FIG. 2C, the hole (opening) 46 for forming the waveguide 45 is formed on the light-receiving sensor portion 32 at its corresponding position.

By selecting a reactive gas used in the reactive ion etching method, for example, a certain selection ratio can be maintained between the insulating film (for example, including the NSG film 35, the barrier layer 40 and the SiN film 34 in addition to the insulating film 37) and the SiN film 34, thereby making it possible to prevent the bottom portion of the hole 46 from being extended through the SiN film 34.

Next, the resist mask 50 is removed and a metal film (Al film) 471 serving as the reflective film 47 which will be described later on is deposited on the whole surface including the hole 46. In order to obtain a constant film thickness of the metal film 471, the metal film 471 is deposited by a CVD (chemical vapor deposition) method which can obtain high coating property (high coverage).

Thus, as shown in FIG. 2D, the metal film 471 is deposited on the surface containing the hole 46.

Next, as shown in FIG. 2E, while the metal film 471 formed on the side wall 461 of the hole 46 is being left, other metal film 471 is etched away by the reactive ion etching method (RIE method), for example.

Next, the transparent material film (for example, $SiO_2$ film) 48 is filled into the hole 46 by using a well-known plasma method or a high-density plasma method (HDP method), for example. Alternatively, an SOG (Spin on Glass) or an SOD (Spin on Dielectric) may be filled into the hole 46 by using a coating method.

Then, a planarization treatment is carried out to remove the material film formed other than the inside of the hole 46 with the result that, as shown in FIG. 2F, the waveguide 45 may have the arrangement in which the reflective film 47 is formed on only the side wall 461 of the hole 46, the transparent material film 48 being filled into the hole 46.

Thereafter, the passivation film 41, the planarization film 42 and the color filter 43 are formed on the whole surface containing the insulating film 37 and the $SiO_2$ film filled into the waveguide 45, in that order, and the on-chip microlens 44 is formed on the color filter 43 at its position corresponding to the light-receiving sensor portion 32, that is, on the upper portion of the hole 46.

In this manner, there is formed the CMOS type solid-state image pickup device having the arrangement for improving efficiency at which light is focused on the light-receiving sensor portion 32 as shown in FIG. 1.

[Cited Patent Reference 1]
Japanese laid-open patent application No. 7-45805

[Cited Patent Reference 2]
Japanese laid-open patent application No. 8-139300

[Cited Patent Reference 3]
Japanese laid-open patent application No. 2002-118245.

As described above, as the reflective film 47 that covers the side wall 461 of the hole 46, the Al film is most suitable for the application to the reflective film 47 from the standpoints in which it has much experience in the semiconductor manufacturing process, it can be easily processed and it has high reflectivity.

Then, as described above, in order to obtain the constant film thickness of the Al film, the Al film is deposited by the CVD method that can obtain the high coating property (high coverage).

However, when the Al film is deposited by the CVD method, the following problems arise.

More specifically, when the reflective film 47 having the high reflectivity is obtained, it is effective to deposit the reflective film 47 in the low temperature region as the deposition condition. In the low temperature region, the reflective film 47 is selectively deposited on the surface of the metal film so that it becomes difficult to directly deposit the Al film on the surface of the insulating layer formed on the side wall 461 of the hole 46, that is, the insulating film 37, the NSG film 35, the barrier film 40 and the SiN film 34.

The reason that deposition in the low temperature region becomes the effective deposition condition when the reflective film 47 having the high reflectivity is obtained is that the deposition condition depends upon occurrence and growth of core in the early stage.

More specifically, when the reflective film is deposited in the low temperature region, in the early stage of the deposition process, relatively small cores are produced on the surface of the substrate at high density, and cores will grow around these cores later so that a continuous film is formed in a certain time period. Accordingly, since a particle size of a crystal grain of this continuous film is small and the surface of this continuous film is not so uneven, it can be expected to obtain a reflective film having high reflectivity.

When on the other hand the reflective film is deposited in the high temperature region, although it becomes possible to directly deposit the Al film on the surface of the insulating layer formed on the side wall 461 of the hole 46, core grows in the state of gas phase in the high temperature region so that an Al gas becomes particles to smudge the surface of the insulating layer. Thus, even when the Al film is deposited on the surface of the insulating layer, the coverage is lowered, the reflectivity is lowered by remarkably-uneven portions produced on the film surface, and further an Al film with poor adhesion relative to the surface of the insulating film is formed unavoidably.

More specifically, when the reflective film is deposited in the high temperature region, in accordance with the progress of the film deposition process in the high temperature region, relatively large cores are produced on the surface of the substrate at low density in the early stage of the film deposition, whereafter cores grow around these cores. However, when the growth of cores proceeds to form a continuous film, respective cores grow large as compared with the case in which the reflective film is deposited in the low temperature region. Accordingly, the grain size of this continuous film is large and uneven portions on the film surface become remarkably large, thereby resulting in the reflectivity of the reflective film being lowered.

In addition, although it is considered to deposit the Al film on the surface of the insulating layer formed on the side wall 461 of the hole 46 by using a sputtering method, in this case, although not shown, a coverage (in particular, side wall coverage) is remarkably low as compared with the case in which the Al film is deposited on the surface of the insulating layer by the CVD method. Therefore, in order to obtain a predetermined film thickness on the side wall 461 of the hole 46, the Al film having a film thickness several times to several 10s of times as high as the above film thickness should be deposited on the surface of the substrate 31. As a result, the later work process becomes very difficult or becomes impossible.

In addition, there is a possibility that a predetermined film thickness cannot be obtained on the side wall 461 of the hole 46 due to an overhanging portion which is peculiar to the sputtering method.

Accordingly, it has been proposed to solve the above-mentioned problem by depositing a metal film (underlayer metal film) between the reflective film (Al film) 47 and the side wall 461 of the hole 46 (that is, the insulating film 37) as an underlayer film, for example.

However, when Vb-group element such as Ta (tantalum) that has been so far for use with a suitable film such as a barrier metal film or an adhesion layer on the periodic table or IVb-group element such as Ti (titanium) on the periodic table is deposited as the underlayer metal film, the following problems arise.

More specifically, in the solid-state image pickup device, in order to decrease interface state of the light-receiving sensor portion or in order to suppress a white spot by restoring disorders of crystal lattices, hydrogen contained in a light-shielding film composed of a plasma SiN film or an Al film formed on the light-receiving sensor portion is supplied to the light-receiving sensor portion.

In the case of FIG. 1, hydrogen is supplied from the SiN film 34 formed near the light-receiving sensor portion 32, for example, to the light-receiving sensor portion 32.

However, since the material of the aforementioned Vb-group element on the periodic table or the IVb-group element on the periodic table has properties in which its hydrogen absorption rate is high, the underlayer film made of such material absorbs the hydrogen supplied from the SiN film 34 to the light-receiving sensor portion 32. As a consequence, the disorders of the above-mentioned interface state and the crystal lattice cannot be improved, and hence properties of the solid-state image pickup device 30 are lowered.

While FIG. 1 shows the case in which the hydrogen is supplied from the SiN film 34 formed near the light-receiving sensor portion 32 to the light-receiving sensor portion 32, such a variant is also possible, in which hydrogen is supplied from a light-shielding film (not shown) or the material film 48 filled into the hole 46 and the like to the light-receiving sensor portion 32.

Even in such case, it is unavoidable that hydrogen is absorbed by the underlayer film.

SUMMARY OF THE INVENTION

In view of the aforesaid aspect, it is an object of the present invention to provide a solid-state image pickup device including a waveguide in which an underlayer film can be restrained from absorbing hydrogen supplied to a light-receiving sensor portion.

It is another object of the present invention to provide a solid-state image pickup device including a waveguide which has a reflective film with excellent surface condition, excellent coverage, excellent adhesion and high reflectivity.

According to an aspect of the present invention, there is provided a solid-state image pickup device which is comprised of a light-receiving sensor portion, an insulating layer formed in the light-receiving sensor portion, a waveguide being formed in the insulating film, a reflective film composed of an Al film deposited by a CVD method, the reflective film covering the side wall of the waveguide and an underlayer film being formed between the reflective film and the side wall of the waveguide, wherein the underlayer film is formed of a VIb-group element on the periodic table.

According to the solid-state image pickup device of the present invention, since the waveguide is formed in the insulating layer on the light-receiving sensor portion, the side wall of the waveguide is covered with the reflective film made of the Al film formed by a CVD method, the underlayer film is formed between the reflective film and the waveguide and the underlayer film is made of the VIb-group element on the periodic table, hydrogen supplied to the light-receiving sensor portion when the solid-state image pickup device is manufactured can be prevented from being absorbed by the underlayer film.

Also, since the reflective film made of the Al film deposited by the CVD method can be deposited in the low temperature region, it is possible to obtain the waveguide including the reflective film with satisfactory surface condition, satisfactory coverage and satisfactory adhesion.

According to the solid-state image pickup device of the present invention, since the hydrogen supplied to the light-receiving sensor portion can be restrained from being absorbed by the underlayer film and the reflective film with satisfactory surface condition, satisfactory coverage and satisfactory adhesion can be obtained, it is possible to obtain the waveguide in which characteristics of the light-receiving sensor portion can be prevented from being deteriorated and which has the reflective film with high reflectivity and high coverage.

Accordingly, it becomes possible to provide the solid-state image pickup device including the highly-efficient waveguide in which focusing efficiency of incident light can be improved considerably.

DESCRIPTION OF THE PREFERRED EMBODIMENT

Figure 3:
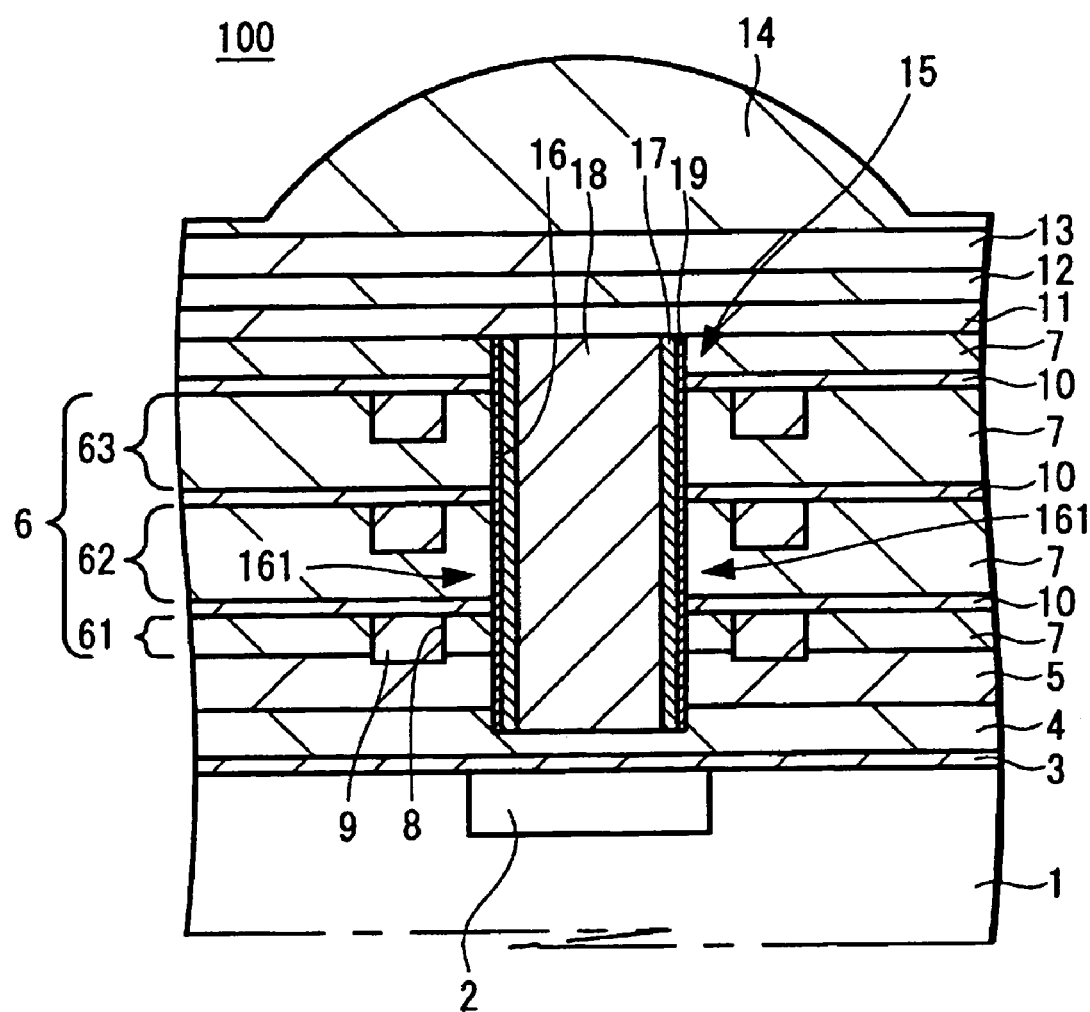
FIG. 3 is a schematic cross-sectional view showing one pixel portion of a solid-state image pickup device according to an embodiment of the present invention.

A solid-state image pickup device according to an embodiment of the present invention will now be described with reference to the drawings. FIG. 3 shows a schematic arrangement of a solid-state image pickup device in which the present invention is applied to a CMOS type solid-state image pickup device (CMOS sensor).

More specifically, FIG. 3 is a cross-sectional view showing one pixel portion of a CMOS type solid-state image pickup device according to an embodiment of the present invention.

A CMOS type solid-state image pickup device, generally depicted by the reference numeral 100 in FIG. 3, includes a semiconductor substrate 1. A light-receiving sensor portion 2 is formed within the semiconductor substrate 1 at its predetermined position, and silicon oxide film (SiO film) 3, for example, having insulating function, surface protection function or surface planarization function is formed on the semiconductor substrate 1. The silicon oxide film 3 has formed thereon a silicon nitride film (SiN film) 4 having surface protection function and function to supply hydrogen to the light-receiving sensor portion 2. Then, this silicon nitride film 4 has formed thereon a non-added silicate glass film (NSG film) 5, and an interconnection layer 6 is formed on this NSG film 5.

The interconnection layer 6 is composed of interconnection layers 61, 62, 63 of three layers. Each of the interconnection layers 61, 62, 63 has an arrangement in which an interconnection material (for example, Cu) 9 is filled into a groove 8 formed at the predetermined position of an insulating film (for example, $SiO_2$ film) 7.

A so-called barrier film (for example, SiN film, SiC film) 10 is formed between the respective interconnection layers 6 in order to prevent the interconnection material (Cu) 9 from being diffused into the insulating film 7. Although not shown, the barrier film 10 is also formed around the groove 8 in order to prevent the interconnection material 9 from being diffused into the insulating film 7.

While the interconnection layer 6 is comprised of the three interconnection layers 61, 62, 63 of the three layers as described above, the present invention is not limited thereto. When the interconnection layer 6 is composed of a plurality of interconnection layers more than the three interconnection layers 61, 62, 63, several insulating films 7 in which the interconnection material 9 is filled into the groove 8 formed at the predetermined position may be laminated in response to the number of the interconnection layers through the barrier film 10.

A passivation film 11 is formed over the interconnection layer 63 of the uppermost layer through the insulating film 7, and a color filter 13 is formed on this passivation layer 11 through a planarization film 12.

The color filter 13 has formed thereon an on-chip microlens 14 at its position corresponding to the light-receiving sensor portion 2.

A waveguide 15 for improving focusing efficiency of incident light is formed from the insulating layer (for example, including one portion of the NSG film 5, the barrier layer 10 and the SiN film 4 in addition to the insulating film 7) to the lower end of the passivation film 11.

The waveguide 15 has an arrangement in which only a side wall 161 of a hole (opening) 16 bored through the insulating layer (for example, including one portion of the NSG film 5, the barrier film 10 and the SiN film 4 in addition to the insulating film 7) is covered with a reflective film 17, a material film ($SiO_2$ film) 18 transparent to visible light being filled into the hole 16.

The reflective film 17 is made of a thin film which can provide high reflectivity, for example, an Al film. This Al film is formed by a CVD method.

Also, this reflective film has a film thickness ranging from 30 nm to 100 nm.

According to this embodiment, an underlayer film 19 is formed, in particular, between the reflective film (Al film) 17 and the side wall 161 of the hole 16. The underlayer film 19 is made of a metal material of VIb-group element on the periodic table.

Three elements of W (tungsten), Mo (molybdenum) and Cr (chromium) may be enumerated as the VIb-group elements on the periodic table. These VIb-group elements on the periodic table have properties in which their hydrogen absorption rates are low as compared with Vb-group elements (Ta, V, Nb) on the periodic table and IVb-group elements (Ti, Zr, Hf) on the periodic table.

This underlayer film 19 is formed by a sputtering method, and this underlayer film 19 has a film thickness ranging from 3 nm to 10 nm.

In this manner, there is constructed the CMOS type solid-state image pickup device having the arrangement to increase efficiency at which incident light can be focused thereon.

According to the solid-state image pickup device 100 of this embodiment, since the waveguide 15 has the underlayer film 19 made of the metal material of the VIb-group element with a low hydrogen absorption rate between the reflective film (Al film) 17 deposited by the CVD method and the side wall 161 of the hole 16, there can be obtained the waveguide 15 in which hydrogen supplied from the SiN film, for example, to the light-receiving sensor portion 2 can be prevented from being absorbed by the underlayer film 19.

According to the solid-state image pickup device 100 of this embodiment, since the underlayer film 19 is formed between the reflective film 17 and the side wall 161 of the hole 16, the reflective film 17 formed on the surface of this underlayer film 19 can be formed as the reflective film 17 that has been formed in the low temperature region.

Thus, it is possible to obtain the reflective film 17 with the excellent surface condition, excellent coverage and excellent adhesion.

Figure 1:
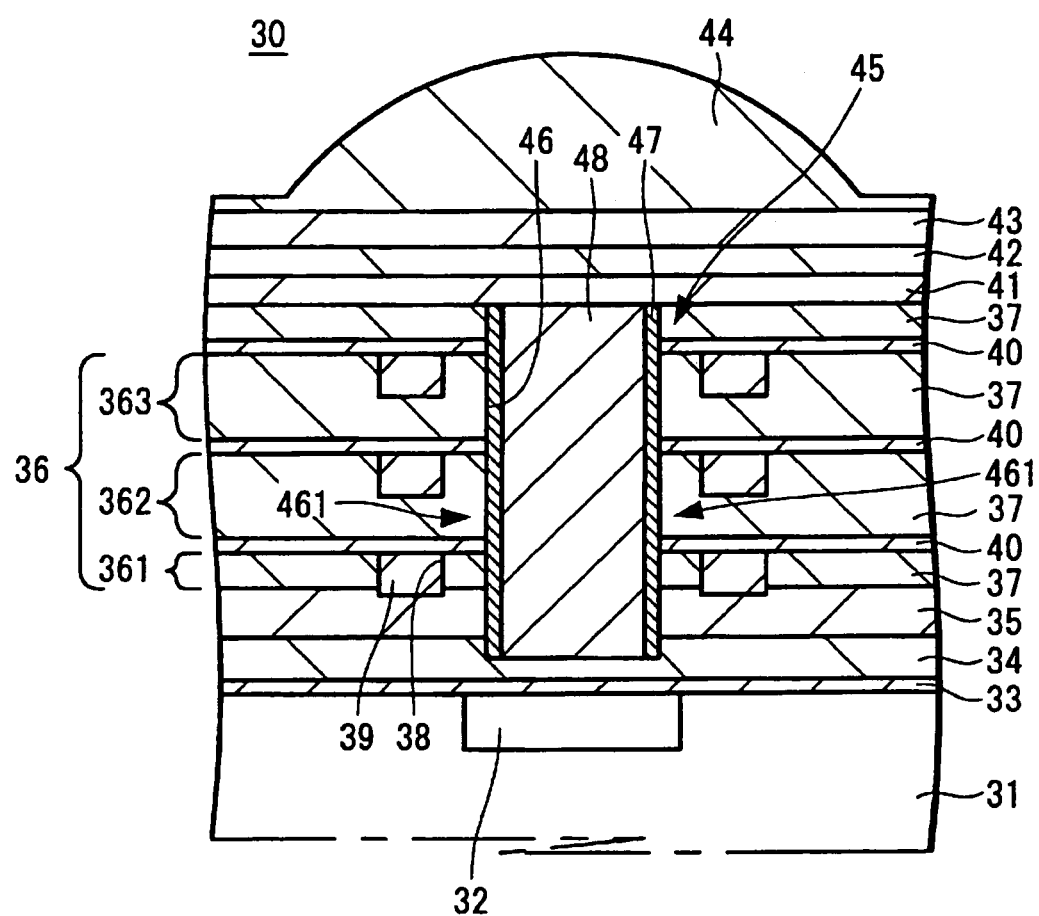
FIG. 1 is a schematic cross-sectional view showing one pixel portion of a CMOS type solid-state image pickup device according to the related art.
Figure 2A:
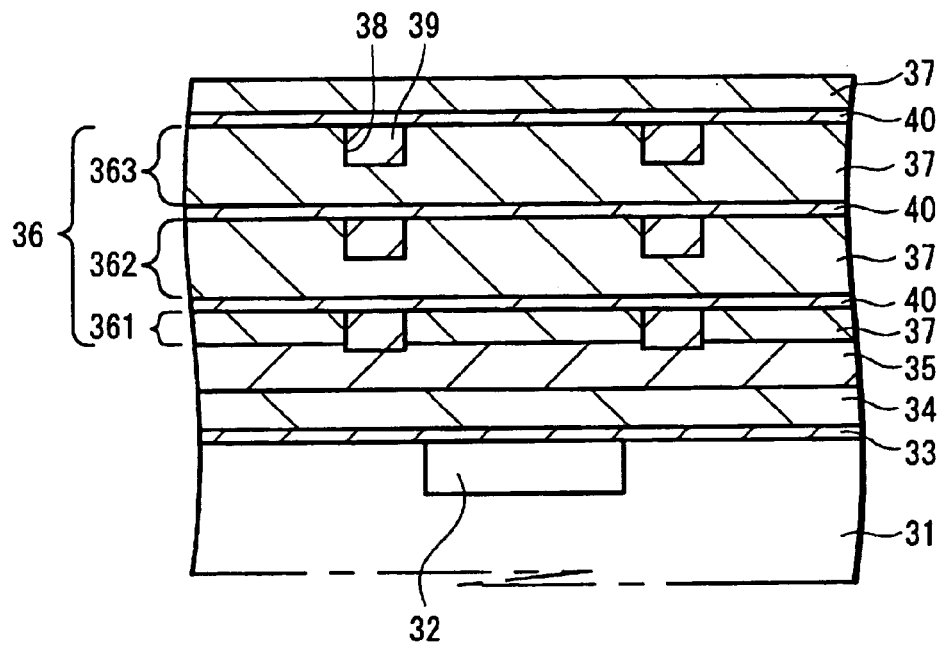
FIGS. 2A to 2F are respectively manufacturing process diagrams of the solid-state image pickup device shown in FIG. 1 according to the related art.
Figure 2B:
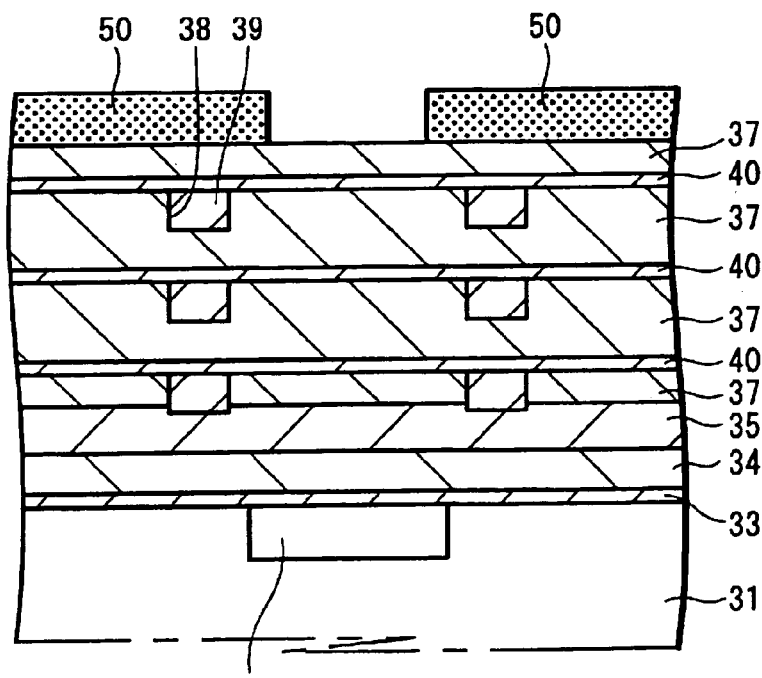
Figure 2C:
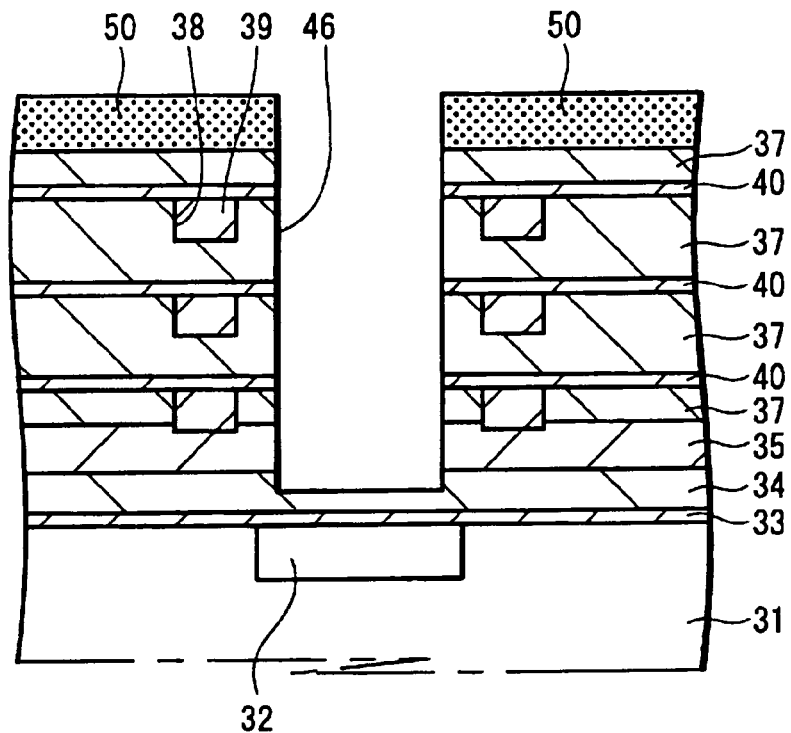
Figure 2D:
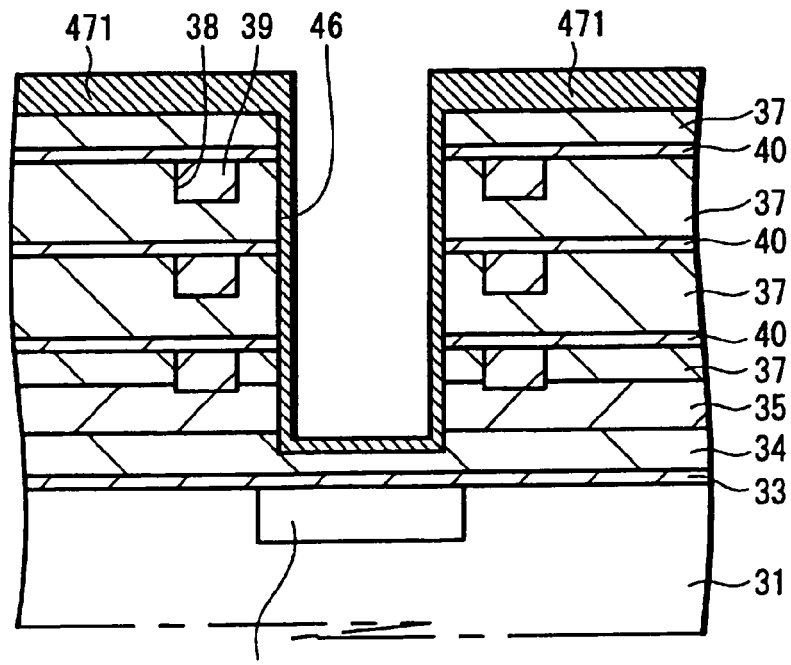
Figure 2E:
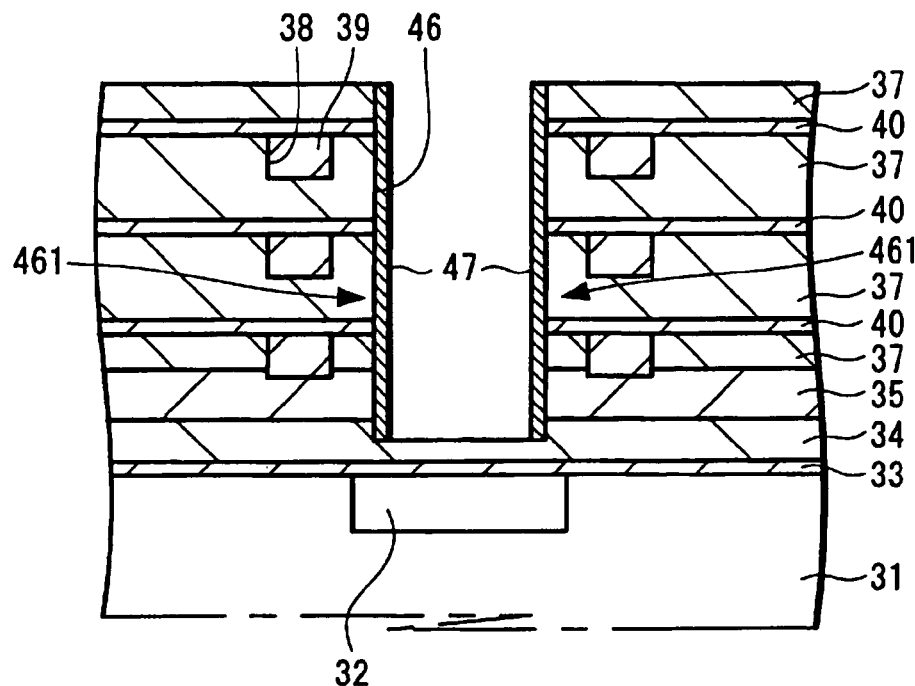
Figure 2F:
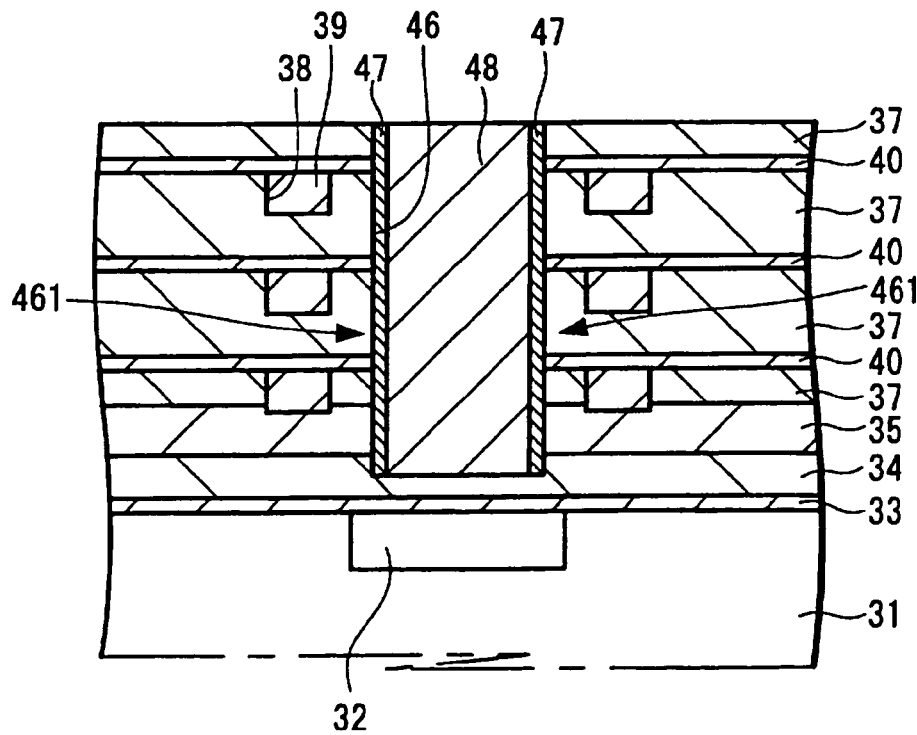

More specifically, when the side wall of the hole is the insulating film (for example, $SiO_2$ film) or the like and the reflective film is directly deposited on the surface of this insulating film by the CVD method like the arrangement shown in FIG. 1, in order to directly deposit the reflective film on the insulating film, the reflective film should be formed in the high temperature region. The reflective film formed at that time is poor in surface condition, the reflective film is not formed with a constant film thickness and further the reflective film has poor adhesion relative to the underlayer film (for example, insulating film).

On the other hand, in the solid-state image pickup device 100 according to this embodiment, since the underlayer film 19 (film made of the metal material of the VIb-group element) is formed on the surface of the insulating film, it becomes possible to form the reflective film (Al film) 17 formed on the surface of this underlayer film 19 not in the high temperature region but in the low temperature region.

As a result, it becomes possible to form the reflective film 17 in the low temperature region, and hence the reflective film 17 with the excellent surface condition in which the surface is smooth can be formed.

Also, the thus formed reflective film 17 may have a constant film thickness and-may be excellent in coverage. There is then no risk that incident light, for example, can be prevented from being shielded by the overhanging portion formed at the opening portion of the hole.

In addition, there can be obtained the reflective film 17 having excellent adhesion relative to the metal film (Al film) 19.

According to this embodiment, while the underlayer metal film 19 is formed by the sputtering method, the present invention is not limited thereto and the underlayer metal film 19 can be formed by a CVD method.

While the underlayer film (film made of the metal material of the VIb-group metal) 19 of the single layer is formed between the side wall 161 of the hole 16 and the reflective film (Al film) 17 according to this embodiment (see FIG. 3), so long as a variation of arrangement does not affect the supply of hydrogen to the light-receiving sensor portion 2, a film for improving adhesion, for example, or a film for improving film quality and film deposition property of the reflective film 17 may be formed between the underlayer film 19 and the reflective film 17.

While the hydrogen is supplied from the SiN film 4 formed near the light-receiving sensor portion 2 to the light-receiving sensor portion 2 in the embodiment shown in FIG. 3, the present invention is not limited thereto, and such a modification also can be considered in which hydrogen is supplied from a light-shielding film (not shown), for example, or the material film 18 filled into the hole 16 and the like to the light-receiving sensor portion 2. The present invention is effective in this arrangement.

As in the above-mentioned embodiment, the present invention is suitable for use with the solid-state image pickup device in which the hydrogen is supplied from the nearby portion of the light-receiving sensor portion, that is, the SiN film 4 formed at the position near the light-receiving sensor portion 2 to the light-receiving sensor portion 2.

FIGS. 4A to 4H show a method of manufacturing the CMOS type solid-state image pickup device shown in FIG. 3 according to the present invention.

FIGS. 4A to 4H show the case in which the CMOS type solid-state image pickup device shown in FIG. 3, in particular, its waveguide is manufactured. This manufacturing method may be effected by using an apparatus including a chamber for making a sputtering method or an apparatus including a chamber for making a CVD method.

FIGS. 4A to 4H are respectively schematic cross-sectional views showing one pixel portion of the CMOS type solid-state image pickup device. In FIGS. 4A to 4H, elements and parts identical to those of FIG. 3 are denoted by the identical reference numerals.

Figure 4A:
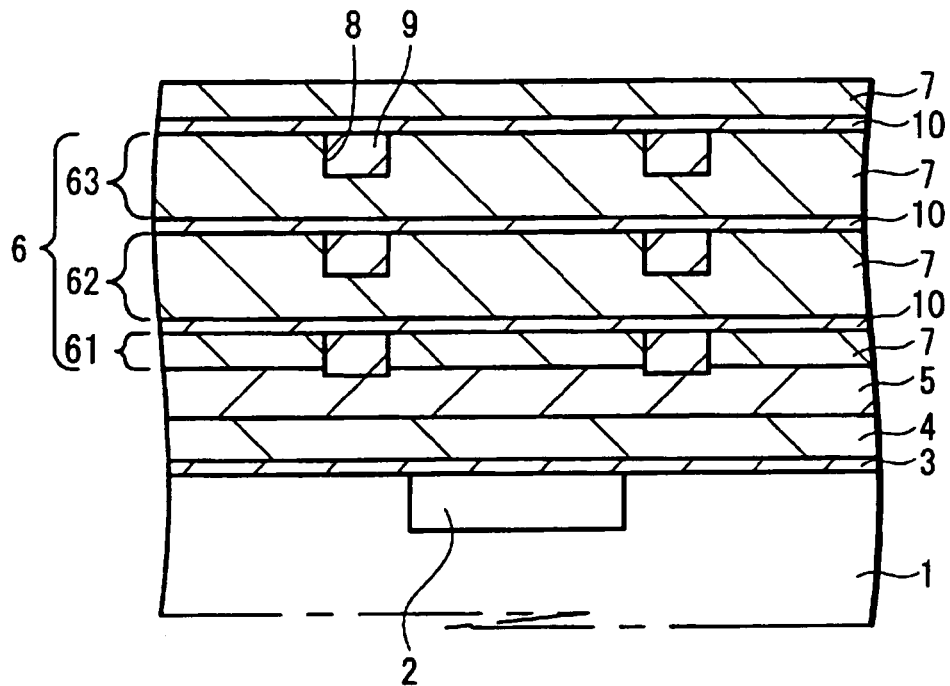
FIGS. 4A to 4H are respectively manufacturing process diagrams showing a method of manufacturing a solid-state image pickup device according to an embodiment of the present invention.

As shown in FIG. 4A. let us start describing this manufacturing method in the state in which the light-receiving sensor portion 2 has already been formed on the semiconductor substrate 1, the silicon oxide film (SiO film) 3, the silicon nitride film (SiN film) 4 and the non-added silicate glass film (NSG film) 5 have already been formed on the light-receiving sensor portion 2, the interconnection layers 61, 62, 62 of the three layers being formed on the NSG film 35.

Figure 4B:
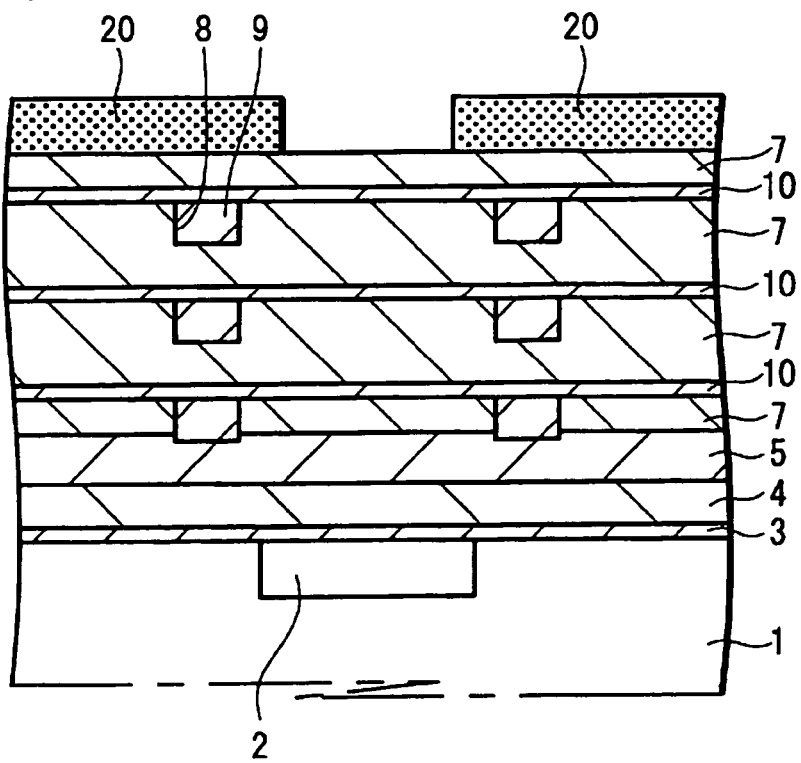

Next, the resist film (not shown) is formed on the insulating film ($SiO_2$ film) 7 formed on the interconnection layer 63 of the uppermost layer, and the resist mask with the pattern for forming the waveguide 15 is formed by patterning this resist film according to the well-known lithography technique as shown in FIG. 4B.

Thereafter, the insulating layer is etched away from the light-receiving sensor portion 2 through this resist mask 20 by a suitable method such as a reactive ion etching method (RIE method).

Figure 4C:
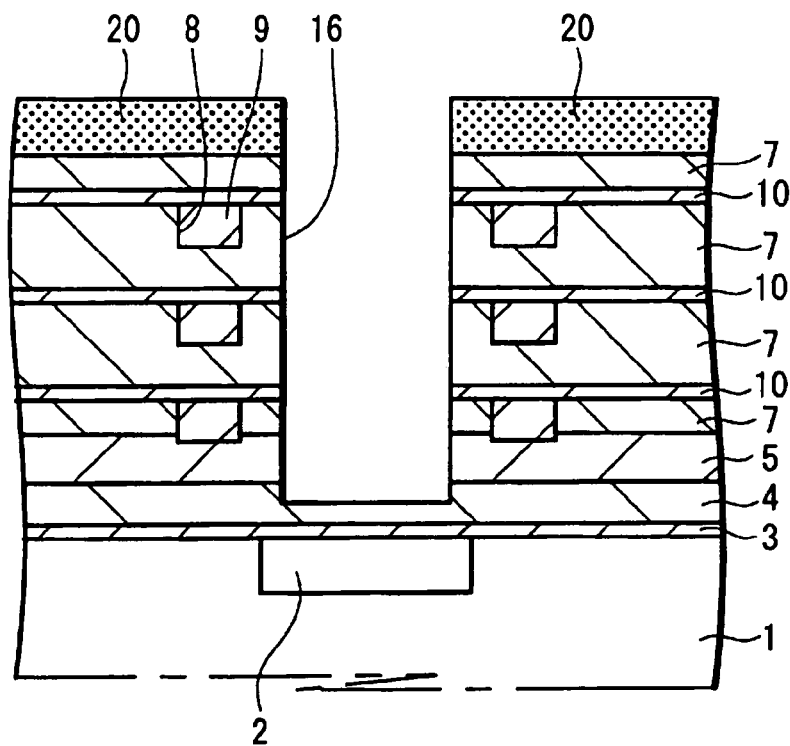

Thus, as shown in FIG. 4C, the hole (opening) 16 for use in forming the waveguide 15 is bored on the light-receiving sensor portion 2 at its corresponding position.

Next, the semiconductor substrate 1, formed by the aforementioned process, in which the hole 16 is bored on the light-receiving sensor portion 2 at its corresponding position, is conveyed into a sputtering chamber.

Then, the film (underlayer metal film) 191 serving as the underlayer film 19 which will be described later on is deposited by a sputtering method. The underlayer metal film 191 is made of a metal material of VIb-group metal on the periodic table, for example, W (tungsten).

When the interconnection layer 6, for example, is comprised of much more interconnection layers and the hole 16 with the high aspect ratio (for example, higher than 1.5), is formed, it is desirable that the underlayer metal film 19 should be deposited by a sputtering method with improved directivity, such as a long-distance sputtering method, a collimation sputtering method and an ionized sputtering method.

Specific film deposition conditions under which the W (tungsten) film is deposited as the underlayer film 191 are shown below.

Figure 4D:
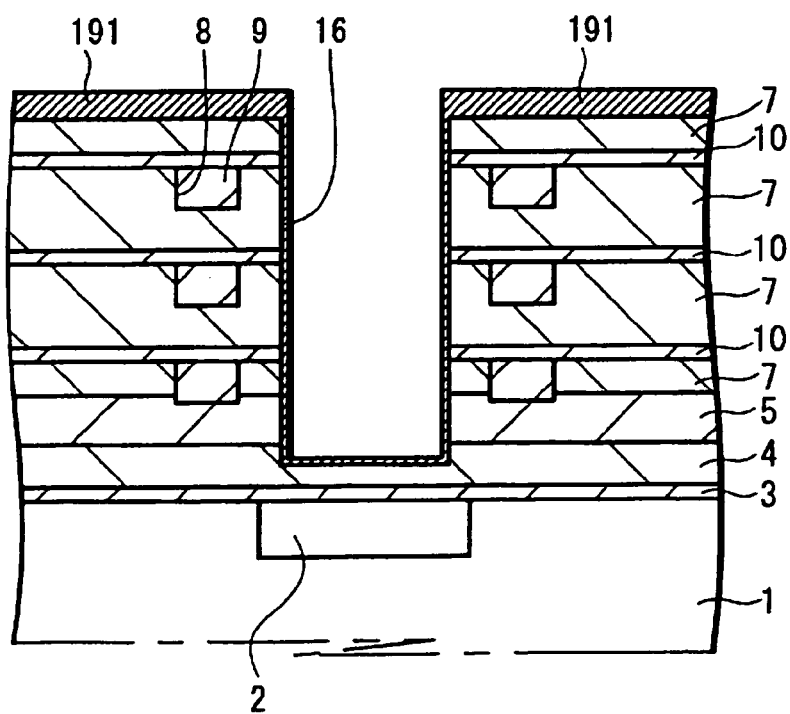

Target: W
Gas, flow rate: Ar gas, 10 sccm
DC power (target power): 15 kW
Substrate temperature: <200° C.
Film thickness: 10 to 50 nm Thus, as shown in FIG. 4D, the underlayer metal film 19 is formed on the surface including the hole 16.

As shown in the aforementioned film deposition conditions, the underlayer metal film 191 having the film thickness ranging from 10 nm to 50 nm is deposited on the semiconductor substrate 1, whereby the underlayer metal film 191 having a film thickness ranging from 3 nm to 10 nm is formed on the side wall 161 of the hole 16.

Subsequently, the semiconductor substrate 1, formed by the aforementioned process, in which the underlayer metal film 191 is formed on the side wall 161 of the hole 16 and the insulating film 7 is conveyed into a CVD chamber without being released from the sputtering chamber to the air.

Then, the film (metal film) 171 serving as the reflective film 17 which will be described later on is deposited on the underlayer metal film 191 including the hole 16 by a CVD method. The metal film 171 is deposited by the Al film.

Concrete film deposition conditions under which the Al film is deposited are shown below.

Gas: MPA (methylpyrrolidine alane) gas
Pressure: 30 Pa
Substrate temperature: 90 to 120° C.
Film thickness: 40 to 100 nm At that time, since the underlayer metal film 191 is formed on the side wall 161 of the hole 16 by the aforementioned process (FIG. 4D), the Al film 171 can be deposited on the metal film by a CVD method, and as shown in the aforementioned film deposition conditions, the Al film 171 can be formed in the low temperature region (90° C. to 120° C.).

Also, as described above, since the semiconductor substrate 1 with the underlayer metal film 191 formed thereon is transported into the CVD chamber without being released from the sputtering chamber to the air, the underlayer metal film 191 can be prevented from being exposed to the air and thereby can be prevented from being oxidized. Consequently, the metal film (Al film) 171 can be deposited satisfactorily.

Figure 4E:
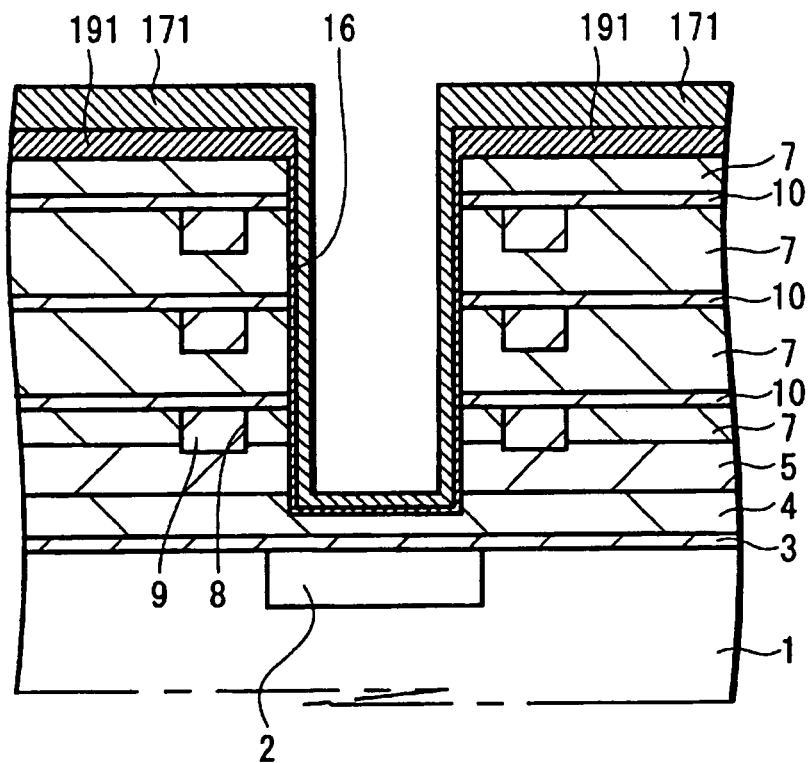

Thus, as shown in FIG. 4E, the metal film (Al film) 171 is deposited on the underlayer metal film 191.

As shown in the film deposition conditions, the metal film (Al film) 171 having the film thickness ranging from 40 to 100 nm is deposited on the semiconductor substrate 1, whereby the metal film 171 having the film thickness ranging from 30 nm to 100 nm can be formed within the hole 16.

While the MPA (methylpyrrolidine alane) gas was used as the gas (precursor gas) required to deposit the Al film by the CVD method as mentioned above, and the present invention is not limited thereto and a DMAH (dimethylaluminum hydride) gas, a TMA (trimethylaluminum) gas and a DMEAA (dimethylethylamine-alane) gas or the like can be suitably used.

Next, while the underlayer metal film 191 and the metal film (Al film) 171 for covering the side wall 161 of the hole 16 are being left, other underlayer metal film 191 and metal film 171 are etched away by a suitable method such as a reactive ion etching method (RIE method).

Figure 4F:
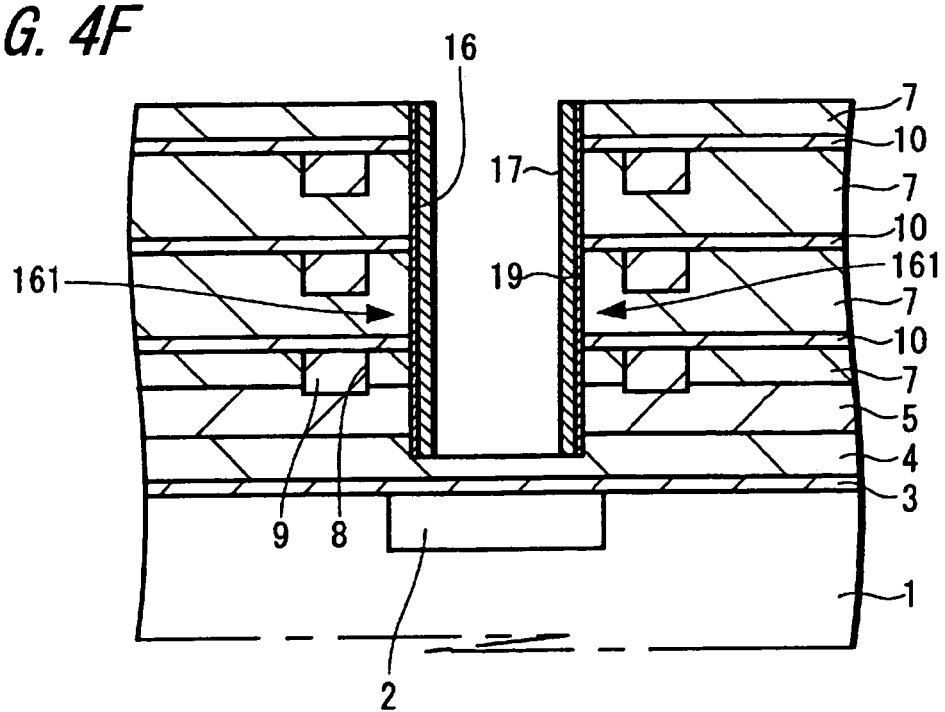

Consequently, as shown in FIG. 4F, there are formed the underlayer film 19 in the state in which the underlayer metal film 191 is formed on only the side wall 461 of the hole 16 and the reflective film 17 in the state in which the metal film 191 is formed on the surface of this underlayer film 19.

Next, a transparent material film (for example, $SiO_2$ film) is filled into the hole 16 by using the well-known plasma method, the high-density plasma method (HDP method) and the like. Alternatively, the SOG (Spin on Glass) or the SOD (Spin on Dielectric) is filled into the hole 16 by using a coating method.

Thereafter, the material film is removed from other portions than the hole 16 by the planarization treatment.

Figure 4G:
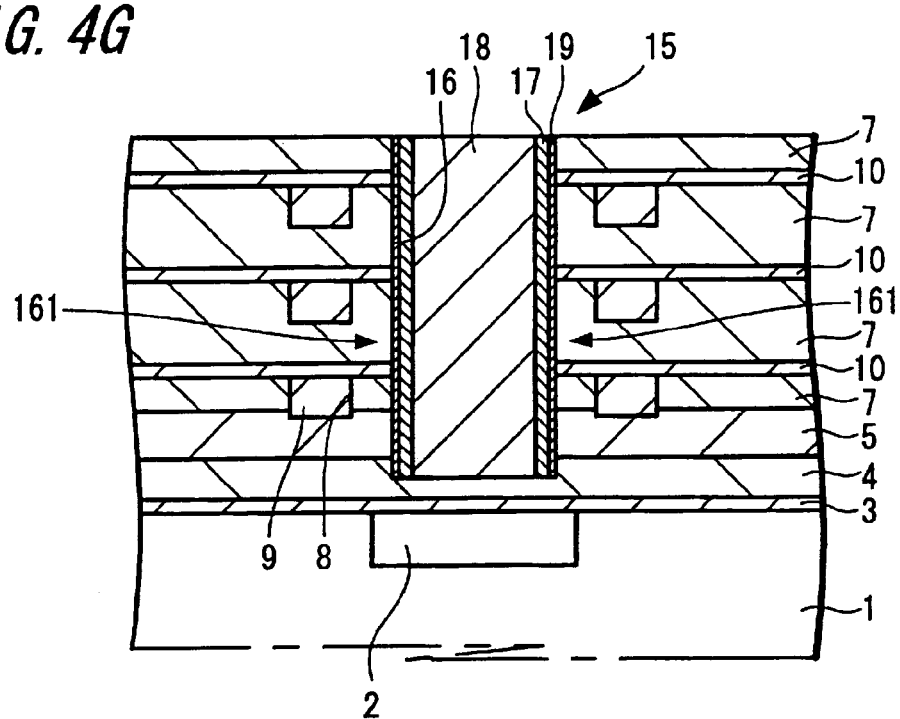

As a result, as shown in FIG. 4G, there is formed the waveguide 15 in which the transparent material film 18 is filled into the hole 16.

Figure 4H:
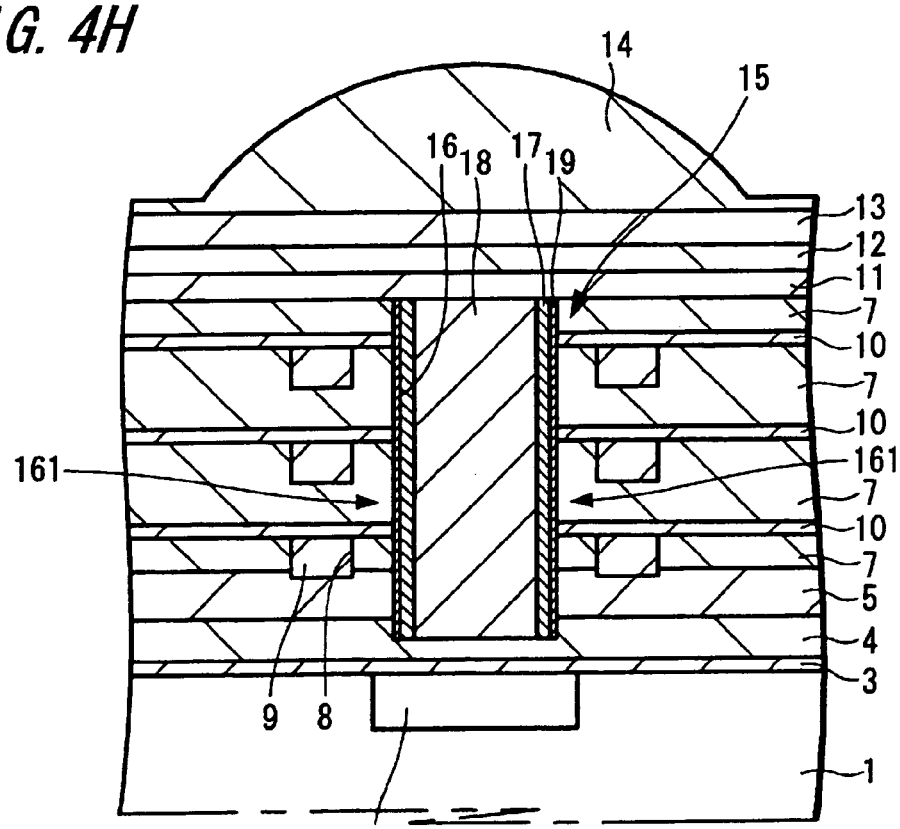

After that, as shown in FIG. 4H, the passivation film 11, the planarization film 12 and the color filter 13 are formed on the whole surface containing the insulating film 7 and the SiO$_2$ film 18 filled into the waveguide 15, in that order, and the on-chip microlens 14 is formed on the color filter 13 at its position corresponding to the light-receiving sensor portion 2, that is, on the upper portion of the hole 16.

In this manner, there is formed the CMOS type solid-state image pickup device 100 including the waveguide for improving focusing efficiency of incident light shown in FIG. 3.

According to the above-mentioned manufacturing method, since the metal film (Al film) 171 serving as the reflection film 17 is deposited by the CVD method after the underlayer metal film (film made of the metal material of VIb-group element on the periodic table) serving as the underlayer film 19 has been deposited on the side wall 161 of the hole 16, when the reflective film is formed by the CVD method, it becomes possible to deposit the reflective film in the low temperature region which is one of the film-deposition conditions for obtaining high reflectivity.

More specifically, as described above, when the reflective film is directly deposited on the surface of the insulating film (SiO$_2$ film) 7 of the side wall 161 of the hole 16 and the like by the CVD method, in order to directly deposit the reflective film 17 on the insulating film 7, the reflective film 17 should be deposited in the high temperature region. As a result, the reflected film 17 deposited at that time becomes poor in surface condition, coverage and adhesion.

On the other hand, according to the above-mentioned manufacturing method, since the underlayer film 19 (film made of the metal material of VIb-group element on the periodic table) is deposited on the surface of the insulating film 7 of the side wall 161 of the hole 16, it becomes possible to form the reflected film (Al film) 17 formed on the surface of the underlayer film 19 not in the high temperature region but in the low temperature region.

Accordingly, when the metal film (Al film) 171 is deposited by the CVD method, the Al film 171 can be deposited on the underlayer metal film 191 satisfactorily. Thus, there can be formed the reflective film 171 with small surface roughness and which has a satisfactory surface condition.

Also, the overhanging portion is not formed on the opening portion of the hole 16 and the side wall 161, and hence the Al film having the constant film thickness can be formed. Thus, it is possible to form the reflective film 17 with satisfactory coverage.

In addition, the Al film 171 can be deposited on the underlayer metal film (film made of the metal material of VIb-group element on the periodic table) 19 with excellent adhesion, and hence there can be formed the reflectivity film 19 with excellent adhesion.

While the present invention is applied to the CMOS type solid-state image pickup device as set forth above in the above-mentioned embodiment, the present invention is not limited thereto, and can be applied to other solid-state image pickup devices such as a CCD solid-state image pickup device.

According to the solid-state image pickup device of the present invention, since the hydrogen supplied to the light-receiving sensor portion can be restrained from being absorbed by the underlayer film and the reflective film with satisfactory surface condition, satisfactory coverage and excellent adhesion is obtained, the characteristics of the light-receiving sensor portion can be prevented from being deteriorated, and it is possible to obtain the waveguide including the reflective film with high reflectivity and high coverage.

Therefore, it becomes possible to provide a solid-state image pickup device including a highly-efficient waveguide in which focusing efficiency of incident light can be improved considerably.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A solid-state image pickup device comprising:
   a light-receiving sensor portion;
   an insulating layer formed in said light-receiving sensor portion;
   a waveguide being formed in said insulating layer; and
   a reflective film composed of an Al film deposited by a CVD method, said reflective film covering a side wall of said waveguide
   wherein reflective film has a first surface facing a light path of said waveguide and a second surface opposite to the first surface and adjacent to an underlayer film, said underlayer film being formed of a VIb-group element of the periodic table.

2. A solid-state image pickup device according to claim 1, wherein said underlayer film is formed by a sputtering method or a CVD method.

* * * * *